US005656515A

United States Patent [19]
Chandrasekhar et al.

[11] Patent Number: 5,656,515
[45] Date of Patent: Aug. 12, 1997

[54] METHOD OF MAKING HIGH-SPEED DOUBLE-HETEROSTRUCTURE BIPOLAR TRANSISTOR DEVICES

[75] Inventors: S. Chandrasekhar, Matawan; Andrew Gomperz Dentai, Atlantic Highlands, both of N.J.; Yasuyuki Miyamoto, Nagareyama, Japan

[73] Assignee: Lucent Technologies, Inc., Murray Hill, N.J.

[21] Appl. No.: 683,291

[22] Filed: Jul. 18, 1996

[51] Int. Cl.⁶ .................................. H01L 21/265
[52] U.S. Cl. .................. 438/319; 257/200; 257/197; 438/320; 438/970
[58] Field of Search .................. 437/31, 89, 133; 148/DIG. 72; 257/200

[56] References Cited

U.S. PATENT DOCUMENTS

| | | | |
|---|---|---|---|
| 5,296,391 | 3/1994 | Sato et al. | 437/31 |
| 5,321,301 | 6/1994 | Sato et al. | 257/592 |
| 5,323,032 | 6/1994 | Sato et al. | 257/198 |
| 5,323,057 | 6/1994 | Cook et al. | 257/591 |
| 5,424,228 | 6/1995 | Imai | 437/31 |
| 5,432,104 | 7/1995 | Sato | 437/31 |
| 5,494,836 | 2/1996 | Imai et al. | 437/89 |
| 5,504,018 | 4/1996 | Sato | 437/31 |

OTHER PUBLICATIONS

"MOCVD–Grown AlGaAs/GaAs HBTs with Epitaxially Embedded p⁺Layers in Extrinsic Base" by K.Taira et al, Electronics Letters, vol. 23, No. 19, pp. 989–990, Sep. 10, 1987.

"High–$f_{max}$ AlGaAs/InGaAs and AlGaAs/GaAs HBTs Fabricated with MomBE Selective Growth . . . " by H.Shimawaki,IEEE Trans. ED, vol. 40, No. 11, p. 2124, Nov. 1993.

*Primary Examiner*—John Niebling
*Assistant Examiner*—Long Pham

[57] ABSTRACT

The lateral base resistance of a DHBT device is reduced and its high-speed operating characteristics thereby improved by forming a structure that initially includes a relatively thick extrinsic base layer overlying a relatively thin intrinsic base layer. The extrinsic base layer is then etched to form a window in which an emitter layer is deposited. In that way, the growth time for formation of the base-emitter junction is minimized. High-performance devices are thereby realized in a relatively simple process that has advantageous self-alignment features.

10 Claims, 4 Drawing Sheets

METHOD OF MAKING HIGH-SPEED DOUBLE-HETEROSTRUCTURE BIPOLAR TRANSISTOR DEVICES

BACKGROUND OF THE INVENTION

This invention relates to compound-semiconductor integrated-circuit (IC) devices and, more particularly, to a method for making high-speed double-heterostructure bipolar transistor (DHBT) devices in IC form.

DHBT devices are well known and have been proposed for use in a wide variety of important practical applications. Thus, for example, DHBT devices are considered attractive candidates for inclusion in high-speed optical communication and processing systems. In such systems, DHBT devices are well suited to be integrated with optical and/or opto-electronic devices.

It is also well known that the high-speed operation of a DHBT device is limited by its base resistance. And it is further known that a large component of the base resistance originates in the so-called extrinsic base region of the device.

Various proposals have been made to reduce the base resistance of a DHBT device by providing a thicker base layer in the extrinsic region than in the intrinsic region of the device. The proposals reported to date use epitaxial regrowth of the extrinsic base after formation of the base-emitter junction in the intrinsic region of the device. To ensure a good-quality junction, these proposals require either a thick undoped layer to offset base dopant diffusion into the emitter layer (see, for example, "MOCVD-Grown AlGaAs/GaAs HBTs with Epitaxially Embedded p$^+$ Layers in Extrinsic Base" by K. Taira et al, *Electronics Letters*, vol. 23, No. 19, pages 989–990, Sep. 10, 1987) or low-temperature regrowth (see, for example, "High-f$_{max}$ AlGaAs/InGaAs and AlGaAs/GaAs HBTs Fabricated with MOMBE Selective Growth in Extrinsic Base Regions" by H. Shimawaki et al, *IEEE Transactions on Electron Devices*, vol. 40, No. 11, page 2124, November 1993). Without such special measures, the location of the base-emitter junction and its movement due to dopant diffusion during the regrowth process have a strong and deleterious influence on the current gain of the device.

Accordingly, efforts have continued by workers skilled in the art aimed at attempting to devise effective ways of improving the speed properties of a DHBT device by reducing its lateral base resistance. In particular, these efforts have been focussed on trying to reduce the base resistance in the extrinsic base region in a relatively simple manner and without deleteriously affecting other properties of the device. It was recognized that these efforts, if successful, could increase the speed of operation of high-performance DHBT devices (as characterized by their unity current-gain cutoff frequency and maximum oscillation frequency) and thereby increase the likelihood that such devices would be used as components in a wide array of very-high-speed applications.

SUMMARY OF THE INVENTION

In accordance with the principles of the present invention, the total base resistance of a DHBT device is reduced by first growing a multi-layer structure that comprises a relatively thin intrinsic base layer and an overlying relatively thick extrinsic base layer. A specified portion of the extrinsic base layer is then etched away to define an intrinsic region of the device. Next, the thickness of the base layer in the intrinsic region is augmented, and then emitter and emitter-contact layers that are self-aligned with respect to the extrinsic base are grown overlying the augmented base layer. Subsequently, the emitter layer is selectively etched to provide an undercut relative to the emitter-contact layer. A basis is thereby established for forming self-aligned emitter and base metal contacts that are electrically isolated from each other. Importantly, the growth time of the base-emitter junction in the intrinsic region of a high-speed device made in this manner is minimized, whereby the quality of the junction and thus the operating properties of the device are enhanced.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

Figure 1:
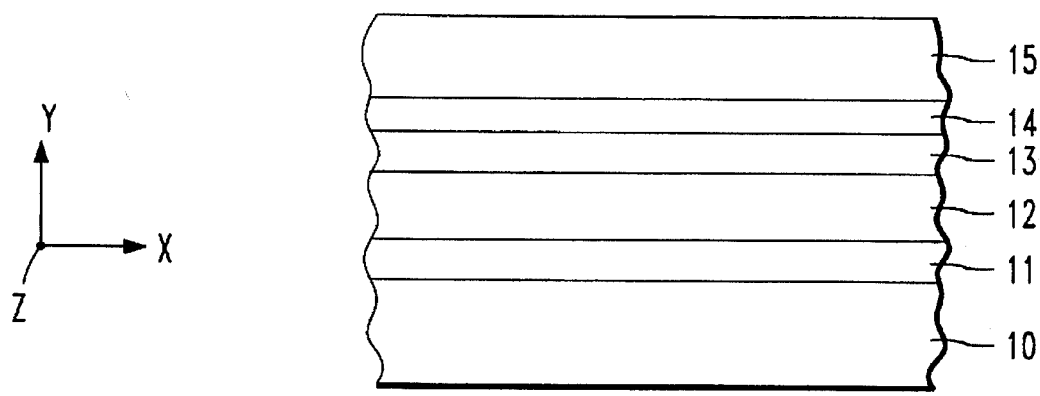
FIG. 1 is a cross-sectional depiction of a multi-layer structure from which, in accordance with the invention, a specific illustrative DHBT device is fabricated.

The fabrication of a specific illustrative DHBT device that embodies the principles of the present invention commences by successively depositing layers 11 through 15 on the planar top surface of a substrate 10, as indicated in FIG. 1. By way of example, the substrate 10 comprises a conventional semiconductor wafer. In one particular embodiment, the substrate 10 comprises a wafer of semi-insulating monocrystalline indium phosphide (Inp). Illustratively, the thickness or Y-direction extent of the substrate 10 is about 500 micrometers (μm) and its diameter is approximately 5 centimeters (cm). Moreover, the particular substrate 10 specified herein is grown such that its (100) crystal axis is parallel to the Y axis depicted in FIG. 1.

In practice, it is advantageous to form multiple identical DHBT devices on the substrate 10 of FIG. 1 in an IC batch-fabrication sequence. Such a sequence, carried out in accordance with the principles of the present invention, is of the type specified below and represented by FIGS. 2 through 7. So as not to unduly complicate the drawing, however, only one such specific illustrative device made by such a fabrication sequence will be explicitly shown and described herein.

The layers 11 through 15 of FIG. 1 comprise, for example, compound-semiconductor layers that are successively formed on or overlying the top surface of the substrate 10. Illustratively, the layers 11 through 15 are successively grown in a conventional metal-organic-vapor-phase-epitaxy (MOVPE) deposition sequence.

The layer 11 of the multi-layer structure shown in FIG. 1 serves as a so-called subcollector or collector-contact layer of the DHBT device(s) to be fabricated. By way of example, the layer 11 is made of p$^+$-type indium gallium arsenide (InGaAs) having a Y-direction thickness of about 600 nanometers (nm).

Alternatively, the subcollector 11 of FIG. 1 may actually comprise a two-layer structure, as described in detail in a commonly assigned copending application of S. Chandrasekhar, A. G. Dentai and Y. Miyamoto, designated Ser. No. 08/657,255, filed on Jun. 3,1996. By utilizing such a two-layer subcollector structure, together with other techniques described in the copending application, the base-collector capacitance of a DHBT device can be established at an advantageously low value, thereby further enhancing the high-speed performance of the device.

Additionally, the layer 12 represented in FIG. 1 may also in practice comprise a multi-layer structure. In that case, the layer 12, which serves as a collector in the indicated device, actually comprises, for example, a quartenary layer of n⁻-type indium gallium arsenic phosphide (InGaAsP) sandwiched between a lower layer of n⁻-type Inp and an upper n⁻-type layer of InGaAs. Such a conventional composite collector exhibits advantageous voltage-breakdown characteristics, as is well known in the art.

In one specific illustrative case in which the layer 12 of FIG. 1 actually comprises a three-layer composite collector structure, the aforementioned InGaAsP layer of such a region is approximately 20 nm thick, the lower collector layer made of InP is about 200 nm thick, and the upper collector layer of InGaAs is approximately 20 nm thick. Moreover, the quaternary layer of the composite collector region is characterized, for example, by energy bandgap and wavelength properties of 0.99 electron-volts and 1.25 μm, respectively.

Next, in accordance with the invention and as represented in FIG. 1, a relatively thin epitaxial layer 13 (about 30 nm thick) made, for example, of p⁺-type InGaAs is grown. In the completed DHBT device, the layer 13 will constitute, illustratively, about two-thirds of the total thickness of the final intrinsic base region. The layer 13 and all of the other p⁺-type InGaAs layers described herein are, for example, zinc-doped to a level of approximately $3 \times 10^{19}$ cm⁻. The doping and final thickness of the intrinsic base of the DHBT device are optimized to achieve advantageous high-speed operating characteristics.

Subsequently, a so-called etch-stop layer 14 (FIG. 1) made, for example, of p⁺-type Inp about 5 nm thick is epitaxially grown. Next, a relatively thick layer 15 (approximately 120 nm thick) made of p⁺-type InGaAs is epitaxially grown. In the completed device, the layer 14 will not appear in the intrinsic region of the device but will constitute a major portion of the thickness of the extrinsic base regions disposed adjacent to the respective sides of the intrinsic region. The thickness and doping of the layer 15 are selected to insure that the lateral resistance of the extrinsic base regions will be only a minor fraction (for example, only about one-third) of that of the intrinsic base region.

In accordance with the invention, the multi-layer structure shown in FIG. 1 is then selectively etched to form a window which defines the extent of the intrinsic region of the DHBT device being fabricated. This is done, for example, by forming a layer of silicon dioxide (SiO₂) about 300 nm thick on the entire top surface of the FIG. 1 structure. In standard ways, the SiO₂ layer is then photolithographically patterned to form a window therein. Subsequently, utilizing the patterned SiO₂ layer as a mask, the underlying layers 15 and 14 of FIG. 1 are successively patterned in isotropic wet-etching steps.

Figure 2:
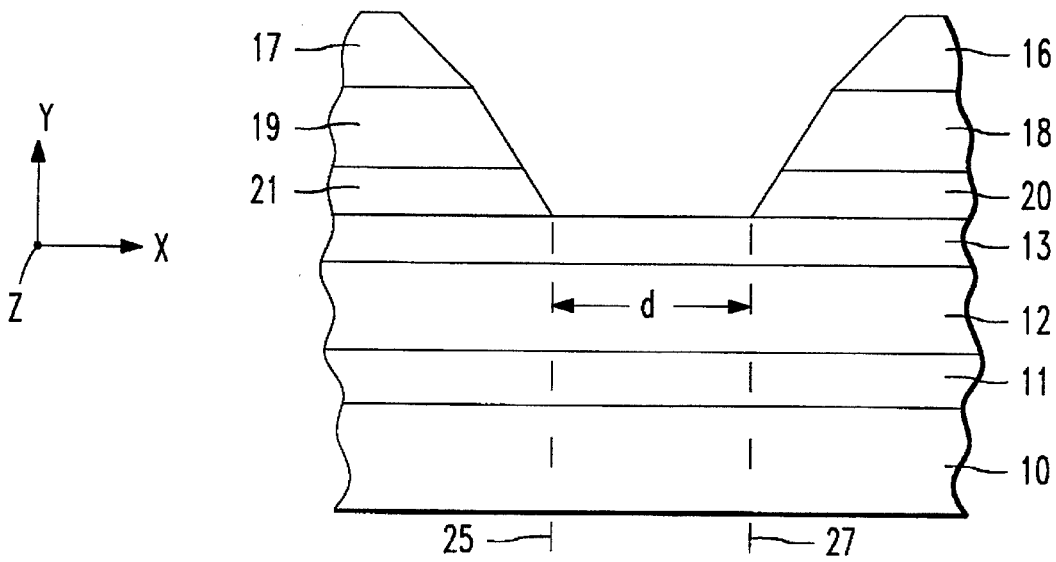
FIGS. 2 through 7 represent a particular exemplary manner in which the FIG. 1 structure is successively processed to make a DHBT device that embodies the principles of the present invention.

More specifically, as indicated in FIG. 2, the aforedescribed SiO₂ mask pattern comprises portions 16 and 17. The SiO₂ mask is formed, for example, by conventional photolithographic definition and wet etching of the SiO₂ layer in buffered hydrofluoric acid. After being etched, the InGaAs layer 15 of FIG. 1 includes remaining portions 18 and 19 (FIG. 2). Etching of the layer 15 to produce a patterned layer including the portions 18 and 19 is carried out, illustratively, by employing a solution comprising one volume of citric acid (30 grams of anhydrous citric acid crystals dissolved in 100 grams of water) to one volume of hydrogen peroxide. The underlying etch-stop layer 14 (FIG. 1) is substantially untouched by such an etching solution.

Next, utilizing the patterned portions 16 through 19 (FIG. 2) as a mask, the Inp layer 14 of FIG. 1 is selectively etched. This is done, for example, in a solution that comprises one volume of hydrochloric acid to one volume of phosphoric acid. Portions of the etched layer 14 that then remain on the structure are shown in FIG. 2 where they are designated by reference numerals 20 and 21. Layers of InGaAs in the structure are substantially untouched during this second-specified wet-etching step.

At that point in the fabrication sequence, the structure depicted in FIG. 2 includes portions 18 and 20 that form part of the extrinsic base region on the right side of the intrinsic region of the DHBT device. The structure further includes portions 19 and 21 that form part of the extrinsic base region on the left side of the intrinsic region. Also, the extrinsic base regions respectively include right- and left-hand portions of the layer 13. The central portion of the layer 13 will constitute a major portion of the intrinsic base region in the final device structure.

In accordance with the inventive procedure described herein, the etched structure depicted in FIG. 2 contains a window with sloping side walls that defines the extent of the intrinsic region of the DHBT device being fabricated. Thus, the vertically extending intrinsic region in which transistor action will be primarily confined in the final device lies approximately between dash reference lines 25 and 27 of FIG. 2. By way of example, this intrinsic region has a lateral or X-direction extent d of about 1-to-5 μm and a Z-direction extent of approximately 5-to-20 μm.

As a result of the aforespecified processing steps, the exposed surface of the intrinsic base layer 13 of FIG. 2 unavoidably contains some defects and impurities. Hence, in accordance with the invention, it is advantageous to epitaxially deposit a fresh layer of p⁺-type InGaAs on the layer 13 before forming a p-n junction in the intrinsic region of the device structure.

Figure 3:
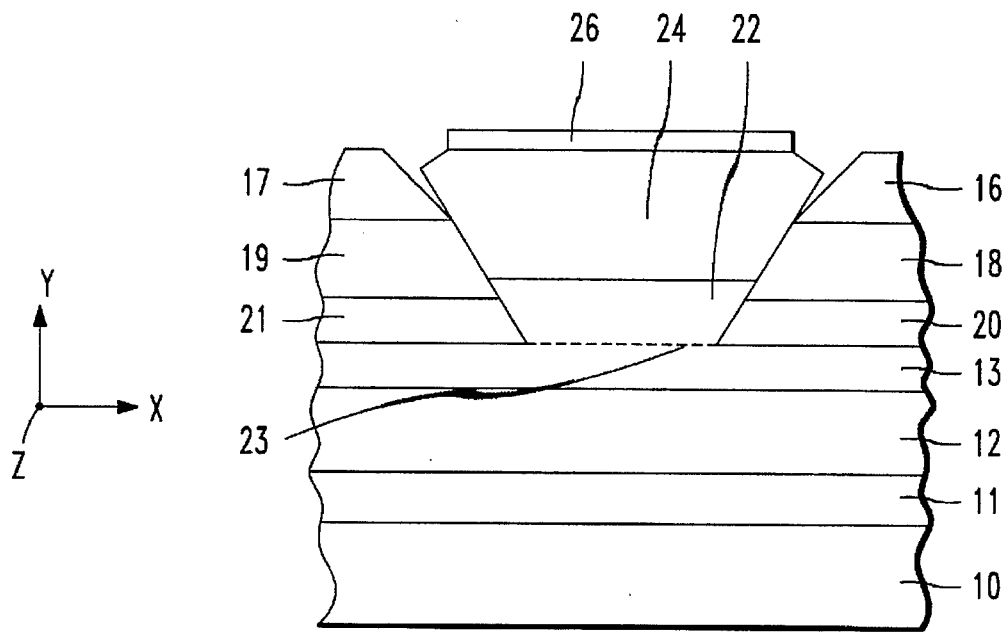
Figure 4:
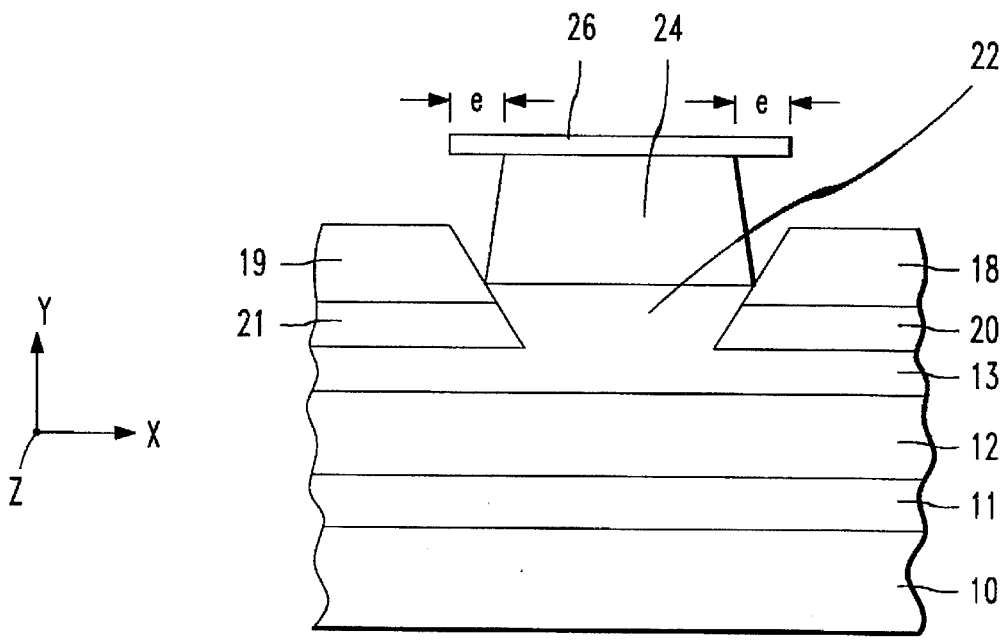

Accordingly, as shown in FIG. 3, the originally formed intrinsic base layer 13 is augmented by an epitaxially grown portion 22 of p⁺-type InGaAs. (Dash reference line 23 is included in FIG. 3 to indicate the location of the original surface of the layer 13 before augmentation.) By way of example, for the particular aforespecified case in which the layer 13 is about 30 nm thick, the portion 22 has a thickness of approximately 15 nm. In that way, process-induced defects and impurities that may exist at or near the original surface 23 of the p⁺-type layer 13 are substantially isolated from the surface of the augmented p⁺-type portion 22. As a result, a p-n junction subsequently formed by depositing an n-type layer on the surface of the portion 22 will exhibit excellent leakage-current and recombination properties.

Next, to form the noted high-quality p-n junction, an epitaxial layer 24 that will serve as the emitter of the DHBT device being fabricated is grown on the layer 22 of FIG. 3. Subsequently, an epitaxial emitter-contact layer 26 is grown on the emitter layer 24. [During these growth steps, polycrystalline versions (not shown) of the layers 24 and 26 are formed on top of the SiO₂ regions 16 and 17] Significantly, the emitter mesa comprising the layers 24 and 26 is thereby formed in a self-aligned manner with respect to the extrinsic base regions of the device structure.

Illustratively, the emitter layer 24 of FIG. 3 is made of n-type Inp and is about 170 nm thick. Further, the emitter-contact layer 26 is made of n⁺-type InGaAs and is approximately 20 nm thick. By way of example, the epitaxial growth of the layers 22, 24 and 26 is carried out at about 590 degrees Celsius.

Importantly, it is characteristic of the formation of the layers 24 and 26 of FIG. 3 that Inp exhibits not only a high growth rate on the (100) crystal facet but also a non-zero growth rate even on the high-index or facet of underlying material. On the other hand, InGaAs is characterized by a high growth rate on the (100) facet of underlying material but a negligible growth rate on the high-index facet of such material.

As a result, as schematically represented in FIG. 3, the epitaxially formed Inp emitter layer 24 grows both vertically and laterally. By contrast, the epitaxially formed InGaAs emitter-contact layer 26 grows vertically to a relatively substantial extent but only negligibly in a lateral direction. As described below, this growth artifact provides a basis for achieving isolation between and self-alignment of subsequently formed emitter and base metal contacts.

Subsequently, processing of the FIG. 3 device structure is carried out to etch away the $SiO_2$ regions 16 and 17. This of course also removes from the structure the aforementioned polycrystalline layers deposited on top of the regions 16 and 17. The emitter layer 24 made of InP is then selectively wet-etched in the aforespecified hydrochloric acid/phosphoric acid solution. This isotropic etching step causes undercutting of the emitter layer 24 relative to the emitter-contact layer 26. In one particular illustrative case, the lateral extent e (FIG. 4) of this undercut on each side of the emitter-contact layer 26 of the FIG. 4 structure is designed to be about 0.2-to-0.3 μm.

Figure 5:
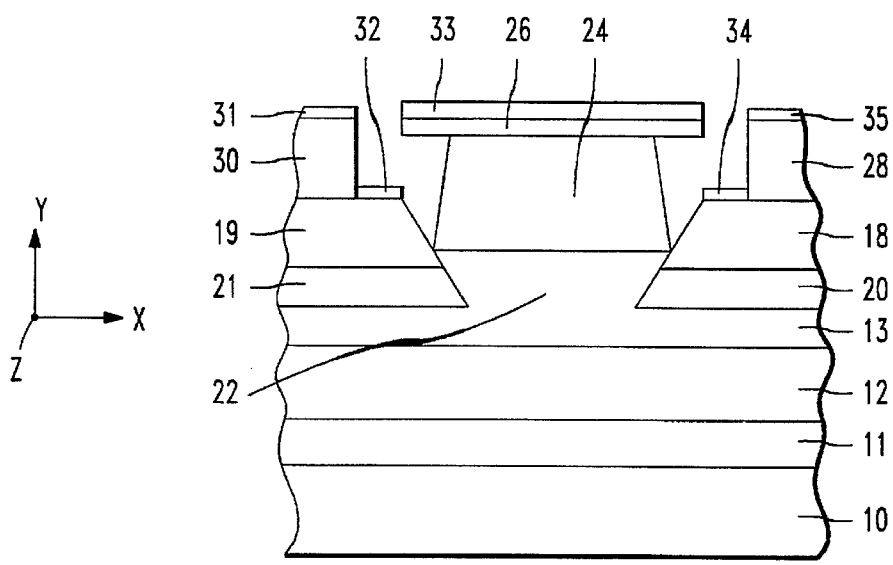

Next, the emitter and base metal contacts of the DHBT device are formed. This is done, for example, by conventional patterning of a layer of photoresist to define a mask. Such a mask, including photoresist portions 28 and 30, is represented in FIG. 5. A layer of metal is then deposited (for example, by evaporation) to cover the entire top surface of the FIG. 5 structure. Reference numerals 31 through 35 in FIG. 5 respectively designate elements of the deposited metal layer.

In practice, the metal layer shown in FIG. 5 advantageously comprises, for example, a conventional tri-layer metallization system that includes, from bottom to top, layers of titanium (Ti), platinum (pt) and gold (Au). Illustratively, the overall thickness of such a known tri-metal layer is about 150 nm.

Subsequently, the device structure represented in FIG. 5 is processed in a standard way to dissolve the photoresist elements 28 and 30, thereby also lifting off from the structure the metal elements 31 and 35. The remaining element 33 comprises the emitter metal contact of the device, whereas the remaining elements 32 and 34 comprise the base metal contacts of the device.

Figure 6:
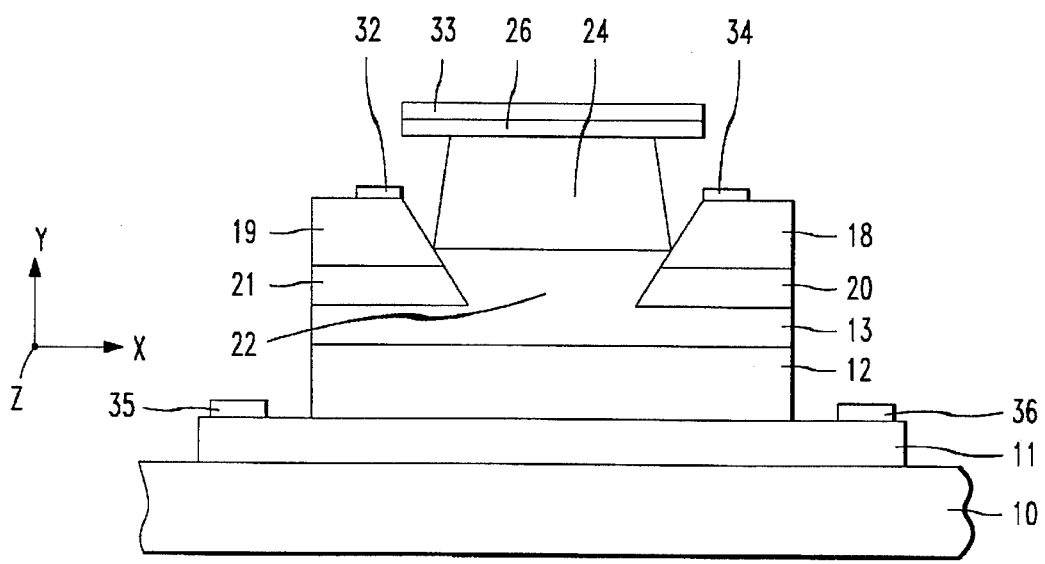

Next, in a series of standard steps, the device structure shown in FIG. 5 is masked by a protective pattern of photoresist (not shown). The relatively thick extrinsic base regions (layers 18, 20 and 13 on the right-hand side of the structure, and layers 19, 21 and 13 on the left-hand side) and the collector layer 12 are then etched to form a mesa, as depicted in FIG. 6. Subsequently, collector metal contacts 35 and 36 are formed by, for example, conventional photolithographic and lift-off techniques utilizing, illustratively, the aforedescribed tri-layer metallization comprising Ti, pt and Au. The thickness of the contacts 35 and 36 is, for instance, about 150-to-200 nm.

The conductive n⁺-type subcollector layer 11 is then selectively etched to electrically isolate from each other the multiple DHBT devices being fabricated on the substrate 10. This is done, for example, by defining a photoresist mask element that covers and protects each individual device structure while the layer 11 is being etched. After being so etched, the layer 11 appears as represented in FIG. 6.

Next, the entire device structure shown in FIG. 6 is advantageously covered with a layer of a flowable substance such as a standard polyimide material to form a coating about 2-to-3 μm thick. After being hardened by heat-curing, the polyimide material becomes an integral part of the final structure. Importantly, the hardened material imparts structural robustness to the device and effectively passivates it.

Figure 7:
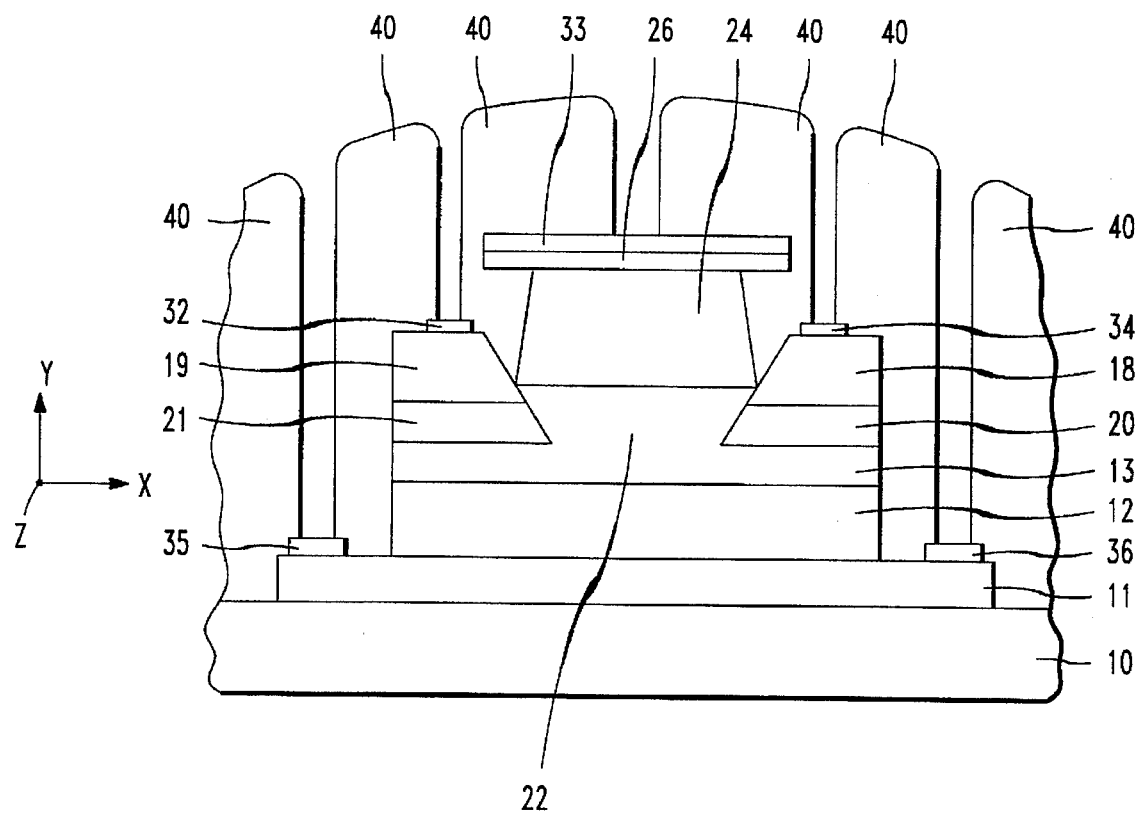

Subsequently, by utilizing standard photolithographic and plasma etching techniques, openings are established in the noted polyimide layer in registry with the aforedescribed metal contacts 32 through 36, as schematically represented in FIG. 7 where reference numeral 40 represents the apertured polyimide layer. In a manner well known in the art, conductive interconnect lines (not shown) are then defined on the surface of the layer 40, and extending into the indicated openings, to establish electrical connections between the metal contacts of the DHBT device and conventional associated external contact pads (not shown).

In accordance with the invention, a significant reduction in the base resistance, and therefore an increase in the speed of operation, of a high-performance DHBT device is achieved in a relatively simple manner. This reduction stems from the fact that the extrinsic base regions are designed to be thick relative to the intrinsic base which is independently designed to have optimal high-performance operating characteristics. Importantly, the quality of the p-n junction in the intrinsic region is significantly enhanced by minimizing the growth time for formation of the junction. That is accomplished by forming the junction after the thickness of the extrinsic base regions has been established. Transistors produced in this way exhibit good direct-current and microwave properties.

Finally, it is to be understood that the above-described arrangements and techniques are only illustrative of the principles of the present invention. In accordance with these principles, numerous modifications and alternatives may be devised by those skilled in the art without departing from the spirit and scope of the invention. Also, it is feasible to incorporate in the device structure described herein the particular inventive techniques specified in the aforecited copending application. In that way, the base-collector capacitance of the aforespecified device can be substantially reduced and its high-speed performance further enhanced.

What is claimed is:

1. A method for making a DHBT device, said method comprising the steps of forming a relatively thick extrinsic base layer of one conductivity type overlying a relatively thin intrinsic base layer of the same conductivity type, said intrinsic base layer having a specified thickness, forming a window in said extrinsic base layer to expose a portion of a surface of said intrinsic base layer, augmenting the thickness of said intrinsic base layer in said window, thereby to form an augmented-thickness intrinsic base layer, and forming an emitter layer of the opposite conductivity type overlying said augmented-thickness intrinsic base layer, thereby to form a junction between said augmented-thickness base layer and said emitter layer.

2. A method of making a DHBT device, said method comprising the steps of successively growing epitaxial layers on a planar top surface of a semiconductor wafer, said epitaxial layers comprising, from bottom to top, a subcollector layer, a collector layer, a relatively thin intrinsic base layer having a specified thickness, an etch-stop layer and a relatively thick extrinsic base layer, etching a window in said extrinsic base and etch-stop layers to define a vertically extending intrinsic region of said device, epitaxially depositing a layer in said window to augment the thickness of said intrinsic base layer, thereby to form an augmented intrinsic base region, epitaxially depositing emitter and emitter-contact layers, in the order, in said window overlying said augmented intrinsic base region, thereby to form a junction between said augmented intrinsic base region and said emitter layer, etching said emitter layer to form undercuts in said emitter layer with respect to said overlying emitter-contact layer, in a single step, depositing self-aligned metal contacts on said emitter-contact layer and on said extrinsic base, patterning said collector layer and said extrinsic bade layer to form a base mesa, depositing a metal contact on said subcollector layer, and etching said subcollector layer to electrically isolate said device from any other devices being fabricated on said wafer.

3. A method as in claim 2 wherein said wafer comprises monocrystalline semi-insulating InP having its (100) crystal axis perpendicular to said planar top surface.

4. A method as in claim 3 wherein said relatively thin intrinsic base layer comprises $p^+$-type InGaAs.

5. A method as in claim 4 wherein said etch-stop layer comprises $p^+$-type InP.

6. A method as in claim 5 wherein said relatively thick extrinsic base layer comprises $p^+$-type InGaAs.

7. A method as in claim 6 wherein the layer epitaxially deposited in said window comprises $p^+$-type InGaAs.

8. A method as in claim 7 wherein the emitter layer epitaxially deposited in said window comprises n-type InP.

9. A method as in claim 8 wherein the emitter-contact layer epitaxially deposited in said window comprises $n^+$-type InGaAs.

10. A method as in claim 9 wherein said emitter layer is isotropically etched in a solution comprising hydrochloric acid and phosphoric acid to undercut the emitter-contact layer.

* * * * *

UNITED STATES PATENT AND TRADEMARK OFFICE
CERTIFICATE OF CORRECTION

PATENT NO. : 5,656,515
DATED : August 12, 1997
INVENTOR(S) : S. Chandrasekhar, Andrew G. Dentai, Yasuyuki Minyamoto It is certified that error appears in the above-identified patent and that said Letters Patent is hereby corrected as shown below:

Please add the folowing as the first paragraph to the Specification in the above-identified Letters Patent, as follows:

Column 1,
Line 3, insert --

ACKNOWLEDGEMENT OF GOVERNMENTAL RIGHTS

This invention was made with Government support under Agreement No. MDA 972-94-3-0036 awarded by ARPA. The Government has certain rights in the invention.

Signed and Sealed this

Eleventh Day of December, 2001

*Attest:*

Nicholas P. Godici

*Attesting Officer*

NICHOLAS P. GODICI
*Acting Director of the United States Patent and Trademark Office*